（12） United States Patent
Li

(10) Patent No.: US 11,302,583 B2
(45) Date of Patent: Apr. 12, 2022

(54) SOLID-PHASE SOURCE DOPING METHOD FOR FINFET STRUCTURE

(71) Applicant: SHANGHAI HUALI INTEGRATED CIRCUIT CORPORATION, Shanghai (CN)

(72) Inventor: Yong Li, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 57 days.

(21) Appl. No.: 17/005,152

(22) Filed: Aug. 27, 2020

(65) Prior Publication Data

US 2021/0407860 A1    Dec. 30, 2021

(30) Foreign Application Priority Data

Jun. 24, 2020   (CN) .................. 202010584726.X

(51) Int. Cl.
*H01L 21/8234*  (2006.01)
*H01L 21/225*   (2006.01)
*H01L 21/8238*  (2006.01)
*H01L 27/092*   (2006.01)

(52) U.S. Cl.
CPC .. *H01L 21/823481* (2013.01); *H01L 21/2255* (2013.01); *H01L 21/823821* (2013.01); *H01L 27/0924* (2013.01)

(58) Field of Classification Search
CPC ......... H01L 21/823481; H01L 21/2255; H01L 21/823821; H01L 27/0924
See application file for complete search history.

(56) References Cited

U.S. PATENT DOCUMENTS

2019/0164809 A1* 5/2019 Meyer ............... H01L 21/28568
2020/0035815 A1* 1/2020 Wu ................... H01L 21/02236

* cited by examiner

*Primary Examiner* — Christine A Enad
(74) *Attorney, Agent, or Firm* — Alston & Bird LLP

(57) ABSTRACT

The a solid-state source doping method for a FinFET device includes: patterning a substrate to have the first structure and the second structure for PMOS and NMOS respectively; depositing a BSG layer and removing part of it on the first structure; depositing a PSG layer on the BSG layer over the second structure, the first structure and the substrate; removing the PSG layer on the second structure; forming a dielectric layer on the PSG and BSG layers; removing the PSG and BSG layers above the dielectric layer; removing the dielectric layer to expose the PSG and BSG layer; depositing a cap layer; annealing to diffuse laterally the phosphorus in the PSG layer and the boron in the BSG layer on the sidewalls into the fin structures; removing the cap layer, depositing an oxide layer and removing the hard mask layer and the buffer layer to expose the fin structure.

14 Claims, 8 Drawing Sheets

SOLID-PHASE SOURCE DOPING METHOD FOR FINFET STRUCTURE

CROSS-REFERENCES TO RELATED APPLICATIONS

This application claims priority to Chinese patent application No. CN 202010584726.X, filed on Jun. 24, 2020 at CNIPA, and entitled "SOLID-PHASE SOURCE DOPING METHOD FOR FINFET STRUCTURE", the disclosure of which is incorporated herein by reference in entirety.

TECHNICAL FIELD

The disclosure relates to the technical field of semiconductors, and in particular, to a solid-phase source doping method for a FinFET structure.

BACKGROUND

With continuous reduction of the CMOS scales, applying FinFET (fin field-effect transistor) devices has become the direction of further technological development in CMOS manufacturing. The main advantage of a FinFET device structure is its superior static integrity, which largely depends on channel morphology. FIG. 1a illustrates a schematic view of an existing FinFET structure, in which the FIN (fin part) is wrapped by the metal gates (MG) below the depth H in the top of FIN. In this structure, the lower part of FIN has a greater punch-through risk, especially when source and drain epitaxial layers are deep and their doping concentration is relatively high as shown in the APT implant density distribution at the lower part of FIG. 1b.

Currently, there is a problem of damage caused by the APT (Anti-Punch-Through) doping implantation. The doping concentration at the top of the FIN is very low, and the mobility of carriers is higher, which is good for the performance of the FIN device; the doping concentration at the bottom of the FIN structure is higher than at the top, and the ability of dopants to diffuse upwards in the FIN into the channels is poor, which is not conducive to the improvement of carrier mobility.

Referring to FIG. 1b and FIG. 1c, FIG. 1b illustrates a schematic view of the APT doping distribution in body region of the existing FIN structure. As mentioned above, under the depth Hfin, APT implant doping profiles at both left and right structures of STI (shallow trench isolation) show the peak and tail distributions near the Wfin-bottom. Meanwhile, Wfin_top, Wfin_middle and Wfin_bottom along the fin depth Hfin illustrate the fin widths at top, middle and bottom of the fin. FIG. 1c illustrates a more detailed view than FIG. 1b of the APT doping distribution at the bottom of the FIN structure. In FIG. 1c, the APT doping profile, turned 90 degrees from FIG. 1b, shows the upper tail of the implant depth is partially merged in the transistor channel in the horizontal axis. Accordingly, the parameters like the FIN height (Hfin) and widths (Wfin_), the APT doping profile (peak area and tail area) are the keys to focus on.

In view of the problem that the process of making FinFET structure cannot simultaneously satisfy the desired high mobility in the channel at the FIN bottom and the risk of the anti-punch-through implant at the bottom of FIN in the prior art.

BRIEF SUMMARY

Embodiments of the disclosure provide a solid-state source doping method for a FinFET structure. The method at least includes the following steps:

step 1: providing a substrate having a stack of layers, wherein the stack of layers comprises a buffer layer on the substrate and a hard mask layer on the buffer layer;

patterning the stack of layers to form a plurality of fin structures, wherein the plurality of fin structures comprises a first structure for a PMOS device, and a second structure for a NMOS device;

step 2: depositing a BSG layer over the first structure and the second structure, and on an upper surface of the substrate between the first and the second structures;

step 3: removing the BSG layer from the first structure while keeping the BSG layer on the second structure;

step 4: depositing a PSG layer on the plurality of fin structures, wherein the PSG layer is configured to cover the BSG layer over the second structure, to cover the first structure, and the upper surface of the substrate between any two adjacent ones of the plurality of fin structures;

step 5: removing the PSG layer from the second structure;

step 6: forming a dielectric layer between any two adjacent ones of the plurality of fin structures, wherein a thickness of the dielectric layer is one third of a height of the plurality of fin structures;

step 7: removing the PSG layer and the BSG layer from top surfaces and sidewalls of the plurality of fin structures above the dielectric layer;

step 8: removing the dielectric layer to expose a remaining PSG layer and a remaining BSG layer;

step 9: depositing a cap layer to cover the plurality of fin structures including the remaining PSG layer and the remaining BSG layer on the sidewalls;

step 10: performing annealing process, wherein phosphorus in the PSG layer diffuses into the first structure and boron in the BSG layer diffuses into the second structure;

step 11: removing the cap layer from above the remaining PSG layer on the first structure and from above the remaining BSG layer on the second structure, followed by depositing an oxide layer to fill a space between any two adjacent ones of the plurality of fin structures; and step 12: removing by etch process the hard mask layer and the buffer layer to complete FinFET source doping.

In some examples, a material of the buffer layer in step 1 comprises silicon dioxide.

In some examples, a material of the hard mask layer in step 1 comprises one of SiN (silicon nitride), a-C (amorphous carbide), a-Si (amorphous silicon), AlN (aluminum nitride), SIOC, and SIC (silicon carbide).

In some examples, the BSG layer in step 2 comprises silicon borate glass having a concentration of boron in a range of 1E20-5E21/cm$^3$.

In some examples, the PSG layer in step 4 comprises silicon phosphate glass having a concentration of phosphorus in a range of 1E20-5E21/cm$^3$.

In some examples, a thickness of the BSG layer deposited in step 2 is in a range of 2-5 nm. In some examples, a thickness of the PSG layer deposited in step 4 is in a range of 2-5 nm.

In some examples, the dielectric layer in step 6 includes one of an organic layer and SiBARC.

In some examples, forming the dielectric layer in step 6 comprises applying a deposition technique.

In some examples, the cap layer deposited in step 9 further covers the remaining PSG layer and the remaining BSG layer on the upper surface of the substrate. In some examples, performing annealing in step 10 further includes diffusion of phosphorus in the PSG layer and diffusion of boron in the BSG layer into the substrate.

In some examples, before the cap layer is deposited in step 9, the remaining PSG layer and the remaining BSG layer are removed from the upper surface of the substrate, while the PSG layer and the BSG layer on the sidewalls of the plurality of fin structures remain.

In some examples, depositing the oxide layer in step 11 comprises a flowable chemical vapor deposition technique. In some examples, step 11 further comprises removing the remaining PSG layer, the remaining BSG layer, and the cap layer before depositing the oxide layer to fill the space between any two said fin structures.

As described above, the solid-state source doping method for the FinFET structure provided by the disclosure has the following beneficial effects: the solid-phase source doping method provided by the disclosure performs different kinds of anti-punch-through doping aiming at the fin structure of NMOS and PMOS, and effectively controls the doping area in the fin structures by using silicon borate glass and silicon phosphate glass with certain thickness, height and concentration, the damage to the fin structures after doping implantation can be avoided, the anti-punch-through performance of implantation is improved, the doping ions can be effectively diffused in the fin structure, the distributions of phosphorus and boron in the fin structures are improved, thus the mobility of carriers is improved, and the performance of the device is improved.

BRIEF DESCRIPTION OF THE DRAWINGS

FIG. 1b illustrates a schematic view of the Anti-Punch-Through (APT) doping distribution in a body region of a FIN structure in FIG. 1a.

FIG. 1c illustrates a schematic view of the APT doping distribution at the bottom of FIN in FIG. 1a.

DETAILED DESCRIPTION OF THE DISCLOSURE

The embodiments of the disclosure will be described below through specific examples, and those skilled in the art can easily understand other advantages and effects of the disclosure from the content disclosed in the description. The disclosure may also be implemented or applied through other different specific embodiments, and various details in the description may also be modified or changed based on different viewpoints and applications without departing from the spirit of the disclosure.

It should be noted that the drawings provided in the embodiments are only used for schematically describing the basic concept of the disclosure, thus only illustrate components related to the disclosure, and are not drawn according to the number, shape and size of the components in the actual implementation. The form, number and scale of the components may be freely changed and the layout of the components may be more complex.

Embodiment 1

Figure 1A:
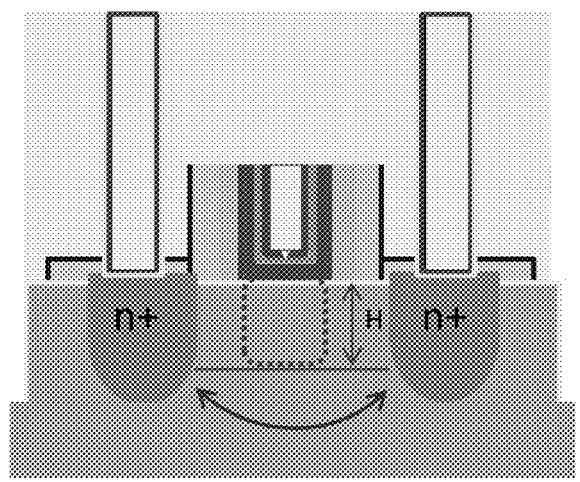
FIG. 1a illustrates a schematic view of a FinFET structure.
Figure 1B:
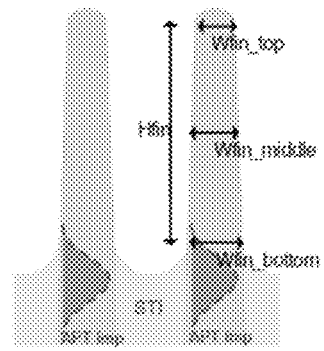
Figure 1C:
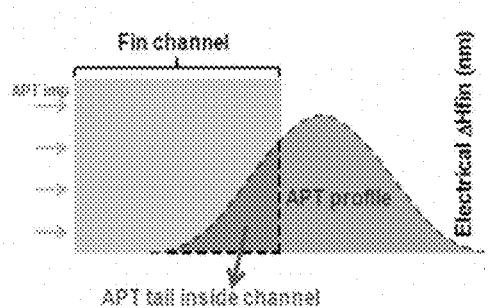
Figure 2A:
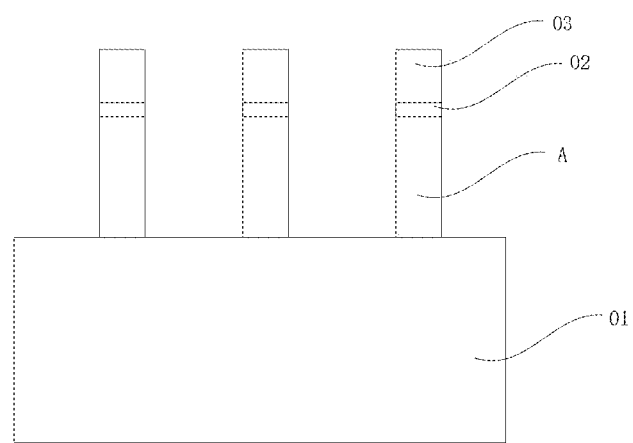
FIGS. 2a-2k illustrate schematic views structures post each fabrication step in the forming of the FinFET solid-phase source doping according to the embodiment 1 of the disclosure.
Figure 4:
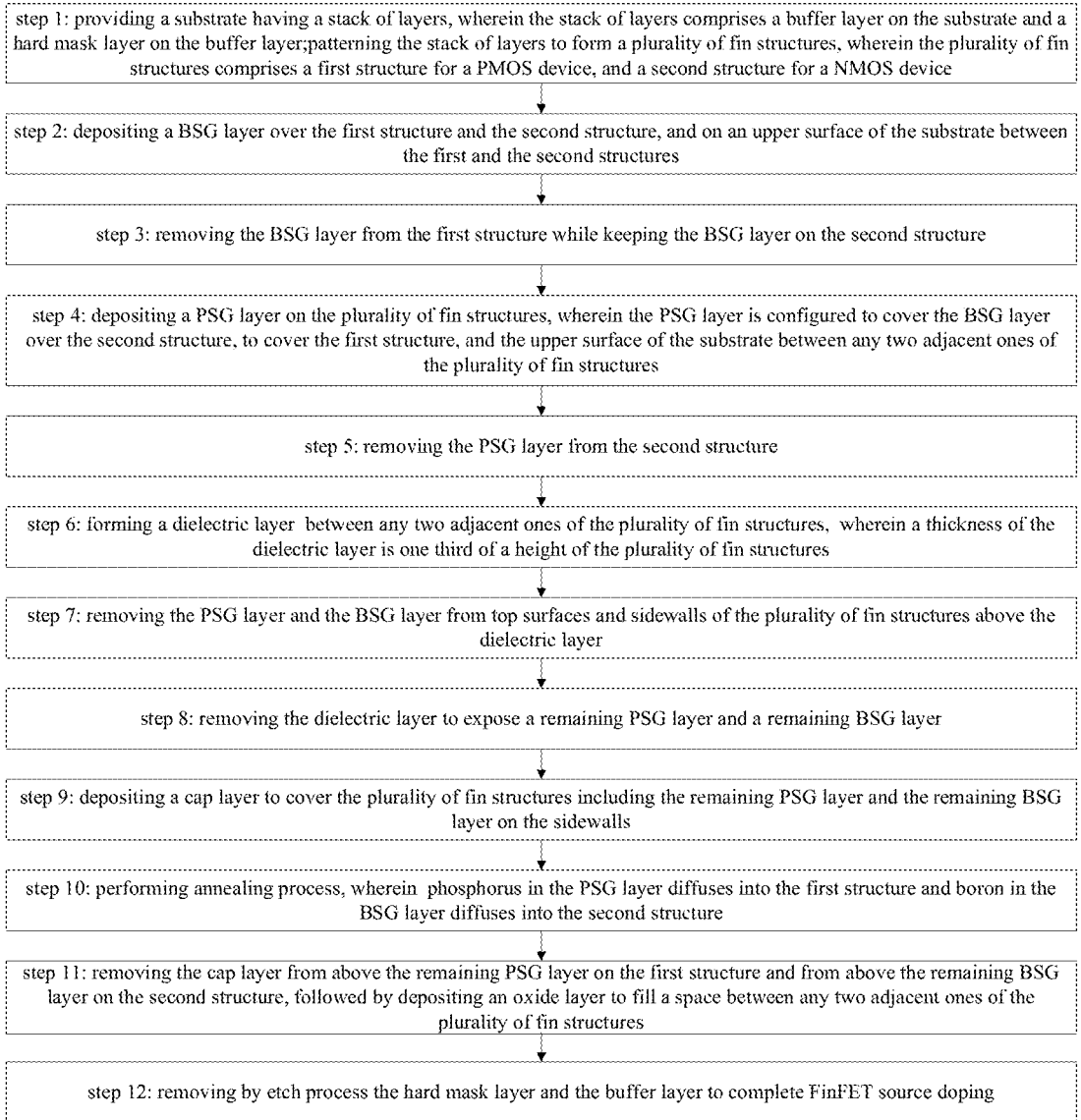
FIG. 4 illustrates a flowchart of the solid-phase source doping method for FinFET devices according to the disclosure.

The disclosure provides a solid-state source doping method for a FinFET structure. FIG. 4 illustrates the flowchart of the FinFET solid-phase source doping method according to the embodiments of the current disclosure. In the present embodiment 1, the method includes the following steps:

In step 1, a substrate is provided and the substrate is patterned to form a plurality of fin structure. A buffer layer is formed on the fin structure. A hard mask layer is formed on the buffer layer. The fin structure, the buffer layer and the hard mask layer form a stack of layers. The stack layer can apply to a PMOS device or an NMOS device. The stack layer used for PMOS forms a first structure. The stack layer used for NMOS forms a second structure. As shown in FIG. 2a, the substrate 01 is patterned to form a plurality of fin structure A, the substrate composes of monocrystalline silicon, so the fin structure are also monocrystalline silicon, and a buffer layer 02 is formed on the fin structure A. A hard mask layer 03 is formed on the buffer layer 02. Before the fin structure are formed, a layer of buffer material is firstly deposited on the substrate, then a layer of hard mask material is deposited on the buffer material. Then the hard mask material, the buffer material and the substrate are etched to form the fin structures in FIG. 2a. According to the embodiment of the disclosure, the structures having the fin structure A, the buffer layer 02 and the hard mask layer 03 form a stack of layers. The first structure is the stack layer for PMOS. For example, in FIG. 2a, the two stack layers on the right out of the three are fabricated as first structure PMOS. According to the embodiment of the disclosure, the second structure is the stack layer NMOS. is a In FIG. 2a, for example, the stack layer at the leftmost out of the three is fabricated to be the second structure NMOS.

Further, in the disclosure, the buffer layer 02 in step 1 of the present embodiment contains silicon dioxide. Further, the hard mask layer 03 in step 1 of the present embodiment is made of silicon nitride. In other embodiments, the hard mask may be made of one of a-C (amorphous carbon), a-Si (amorphous silicon), AlN (aluminum Nitrite), SIOC (polysilocarb) and SiC (silicon carbide).

Figure 2B:
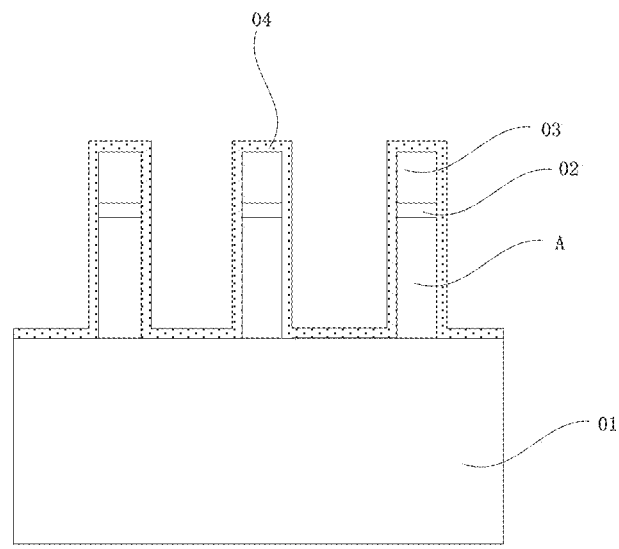

In step 2, a silicon borate glass (BSG) layer is deposited to cover the stack layers and the upper surface of the substrate. Referring to FIG. 2b, a BSG layer 04 is deposited on the sidewalls and the top surfaces of the stack layers and the remaining upper surfaces of the substrate 01. The BSG layer 04 covers the sidewalls of the fin structure A, the sidewalls of the buffer layer 02, and the sidewalls and top surfaces of the hard mask layer 03, and also the upper surfaces of the substrate in between the fin structures. Further, the concentration of boron element in the BSG layer in step 2 is in the range of $1E^{20}$-$5E^{21}$/$cm^3$. Further, the thickness of the BSG layer deposited in step 2 is preferred between 2-5 nm, and the thickness of the BSG layer deposited in the present embodiment is about 5 nm.

Figure 2C:
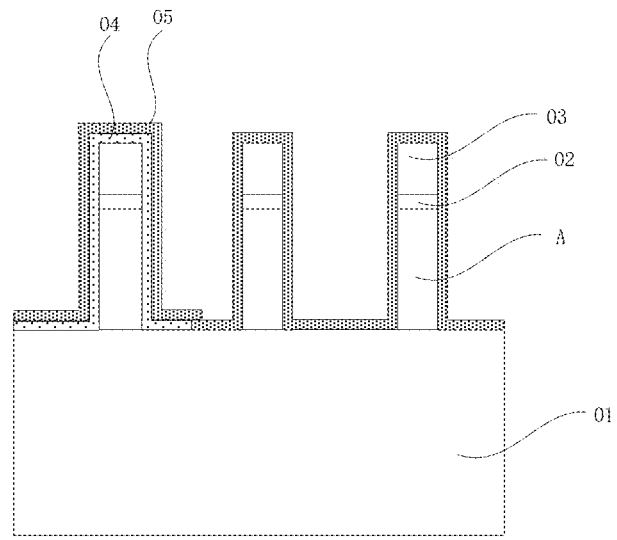

In step 3, the BSG layer on the first structure is removed and the BSG layer on the second structure remains. Referring to FIG. 2c, The BSG layer 04 on the first structure (the two stack layers on the right are for PMOS device) is removed, and the BSG layer 04 on the second structure (one stack layer on the left are for NMOS device) remains.

In step 4, a silicon phosphate glass (PSG) layer 05 is deposited. The PSG layer is disposed on the BSG layer on the second structure for NMOS, on the first structure for PMOS and also on the remaining upper surface of the substrate 01 between the fin structures. Referring to FIG. 2c, for the second structure, the PSG layer 05 is deposited in step 4 covers the BSG layer 04 on the second structure for NMOS, the sidewalls and top surface of the first structure for PMOS, and the remaining upper surface of the substrate 01 between the fin structures.

Further, in step 4, the PSG layer 05 has concentration of phosphorus in the silicon phosphate glass in the range of $1E^{20}$-$5E^{21}$/cm$^3$. Further, the thickness of the PSG layer deposited in step 4 is preferred between 2-5 nm, and the thickness of the PSG layer deposited in the present embodiment is about 5 nm.

Figure 2D:
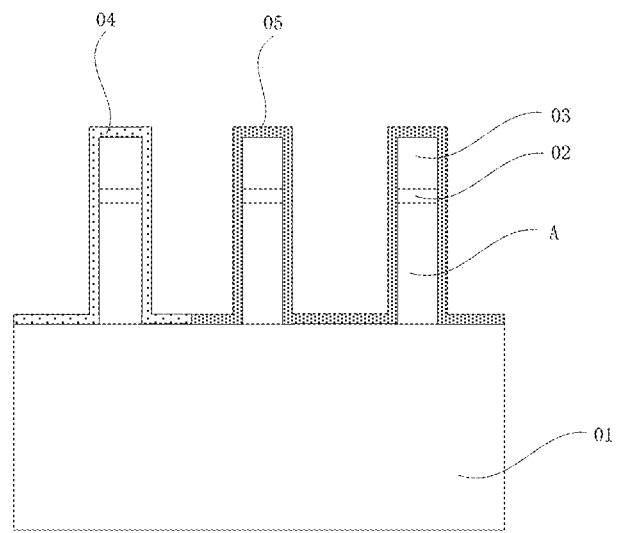

In step 5, the PSG layer 05 on the second structure is removed and the PSG layer 05 on the first structure is remains. The resultant structure is illustrated in FIG. 2d.

Figure 2E:
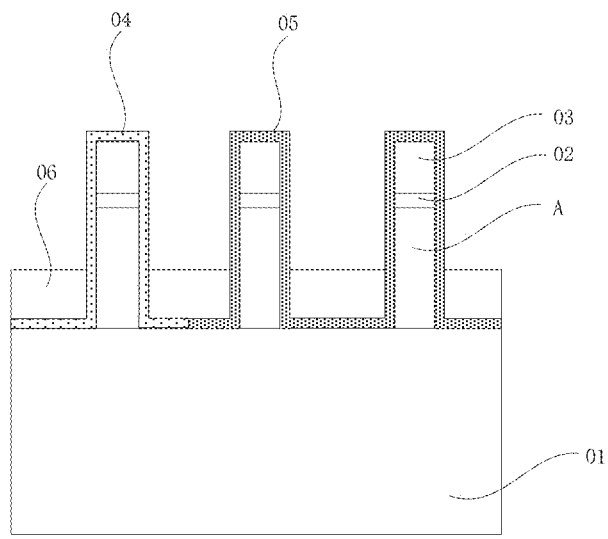

In step 6, a dielectric layer 06 is disposed in trenches between the stack layers and on the lower parts of the PSG layer 05 and the BSG layer 04 over the upper surface of the substrate 01. The thickness of the dielectric layer 06 is preferred to be one third of the height of the fin structures A. Further, the materials of the dielectric layer 06 in step 6 includes one organic layer and an antireflection coating layer such as silicon bottom Anti-Reflective Coating (—Si-BARC). Further, a method for forming the dielectric layer 06 in step 6 involves different deposition techniques. Referring to FIG. 2e, the dielectric layer 06 deposited in step 6 fills spaces between the stack layers and covers the lower portions of the PSG layer 05 and the BSG layer 04 close to the substrate 01, and the thickness of the formed dielectric layer 06 is about one third of the height of the fin structure A.

Figure 2F:
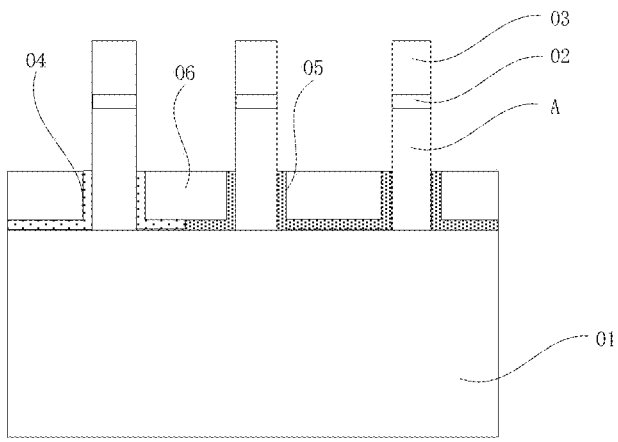

In step 7, the PSG layer 05 and the BSG layer 04 on the sidewalls and top surfaces of the stack layers above the dielectric layer 06 are removed. Referring to FIG. 2f, the portions of the PSG layer 05 and the BSG layer 04 on the top surfaces of the stack layers, either the first structure or the second structure, are removed. Portions of the PSG layer 05 and the BSG layer 04 on the sidewalls of the stack layers, either the first structure or the second structure, are also removed, and the removed portions of PSG layer 05 and BSG layer 04 are those located above the dielectric layer 06.

Figure 2G:
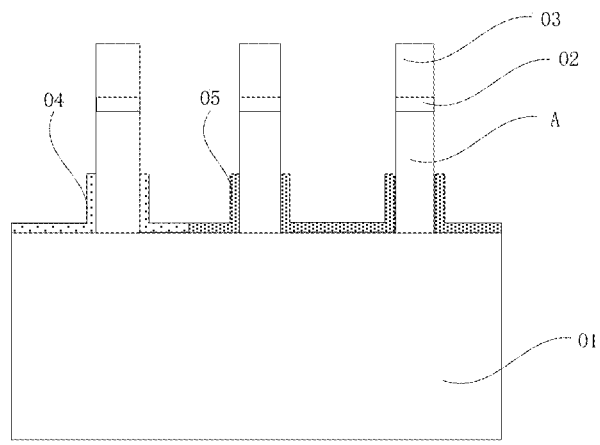

In step 8, the dielectric layer 06 is removed to expose the remaining PSG layer 05 and BSG layer 04 on the sidewalls of the fin structure, and the PSG layer 05 and the BSG layer 04 on the upper surface of the substrate 01. Referring to FIG. 2g, after the dielectric layer 06 is removed, the remaining PSG layer 05 on the sidewalls of the first structure and the remaining BSG layer 04 on the sidewalls of the second structure are exposed, the height of the exposed BSG layer 04 and PSG layer 05 is one third of the height of the fin structure A. The remaining PSG layer 05 and BSG layer 04 on the upper surface of the substrate 01 are also exposed after the dielectric layer 06 is removed.

Figure 2H:
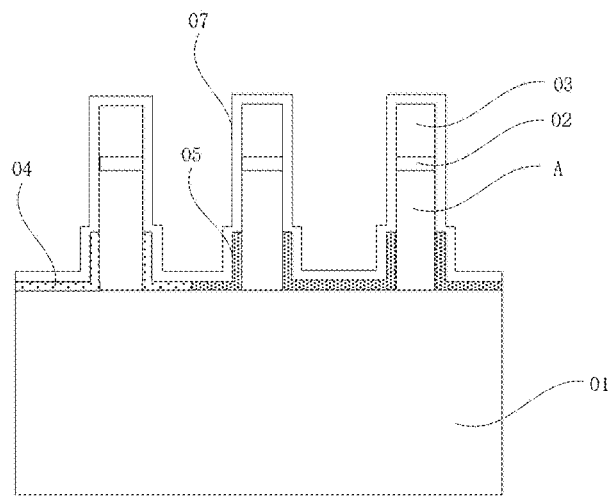

In step 9, a cap layer 07 is deposited to cover the stack layers, the remaining PSG layer 05 and the BSG layer 04 on the sidewalls of the fin structure. Referring to FIG. 2h, the cap layer 07 deposited in step 9 covers a number of surfaces including the top surfaces and sidewalls of the hard mask layer 03 which form partially the first and second structures, the sidewalls of the buffer layer 02, and the sidewalls of the fin structure located at the part above the PSG layer 05 and the BSG layer 04. At the same time, the cap layer 07 is also deposited to cover the remaining PSG layer 05 and the BSG layer 04. Further, in the disclosure, the cap layer deposited in step 9 covers the PSG layer 05 and BSG layer 04 remaining on the sidewalls of the fin structure, as well as the PSG layer 05 and BSG layer 04 disposed on the upper surface of the substrate 01. In other words, one part of the PSG layer 05 or one part of the BSG layer 04 is located on the sidewalls of the fin structure, the other part is the PSG 05 or BSG 04 is located directly on the upper surface of the substrate 01. The cap layer 07 fully covers the PSG layer 05 and BSG layer 04 for both parts on the sidewalls of the fin structure and on the substrate 01.

Figure 2I:
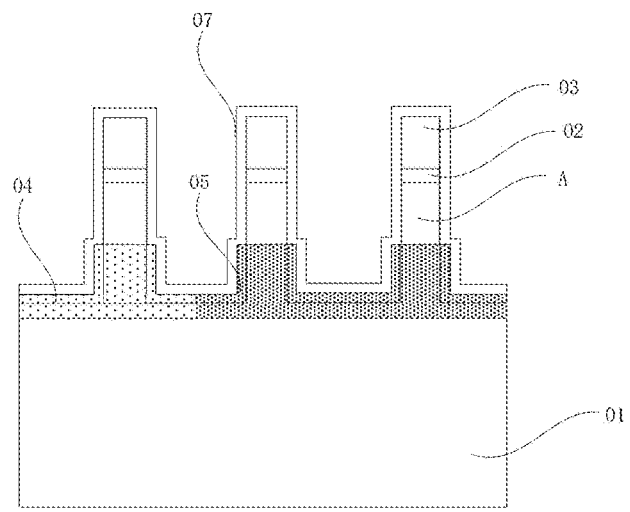

In step 10, annealing is performed to drive diffusion laterally of phosphorus in the PSG layer 05 and boron in the BSG layer 04 into the fin structure. Further, after annealing is performed in step 10, phosphorus in the PSG layer 05 and boron in the BSG layer 04 on the upper surface of the substrate 01 diffuse into the substrate 01. Referring to FIG. 2I, the PSG layer 05 and the BSG layer 04 each includes two parts, one part being attached to the sidewalls of the fin structure, and the other part being arranged in contact with the upper surface of the substrate 01, phosphorus in the PSG layer 05 and boron in the BSG layer 04 attached to the sidewalls of the fin structure respectively diffuse laterally into the fin structure from where the PSG layer 05 and the BSG layer 04 are located. At the same time, phosphorus in the PSG layer 05 and boron in the BSG layer 04 disposed on the substrate 01 respectively diffuse into the substrate 01, and the diffusion distributions are illustrated as shaded areas in the lower parts of the fin structures and in the top surface areas of the substrate 01 in FIG. 2i.

Figure 2J:
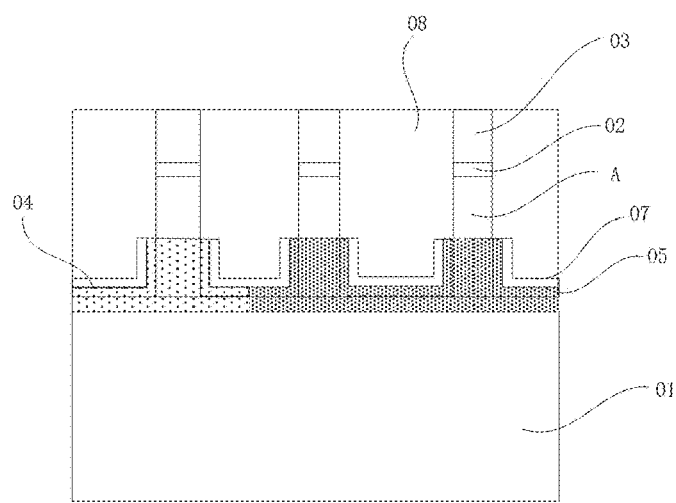

In step 11, the cap layer 07 above the PSG layer 05 and the BSG layer 04 is removed by etching, followed by depositing an oxide layer 08 to fill spaces between the stack layers. Referring to FIG. 2j, the cap layer 07 on the sidewalls of the fin structure above the PSG layer 05 and BSG layer 04 is removed. The cap layer 07 on the sidewalls of the buffer layer 02 and the cap layer 07 on the sidewalls and the top of the hard mask layer 03 are fully removed at the same time, however, the portion of the cap layer 07 attached to the PSG layer 05 or the BSG layer 04 is kept intact. Next, the oxide layer 08 is disposed to fill the spaces between the stack layers. At the end, the oxide layer 08 covers the stack layers and the cap layer 07 between the stack layers. Further, the method for depositing the oxide layer 08 in step 11 is a flowable chemical vapor deposition (CVD) technique. After the oxide layer is deposited, annealing is performed, followed by chemical mechanical planarization (CMP) until the top surface of the hard mask 03 is exposed. The formed structure is as illustrated in FIG. 2j.

In other embodiments, after the cap layer 07 above the PSG layer 05 or the BSG layer 04 is removed by etching in step 11, the remaining PSG layer 05, the BSG layer 04 and the cap layer 07 may be fully removed, and then the oxide layer 08 is deposited to fill the spaces between the stack layers. Fully removing the remaining PSG layer 05, the BSG layer 04, and the cap layer 07 is more conducive to more effectively filling the subsequent oxide layer between the stack layers. This scenario is not show in the disclosed figures.

Figure 2K:
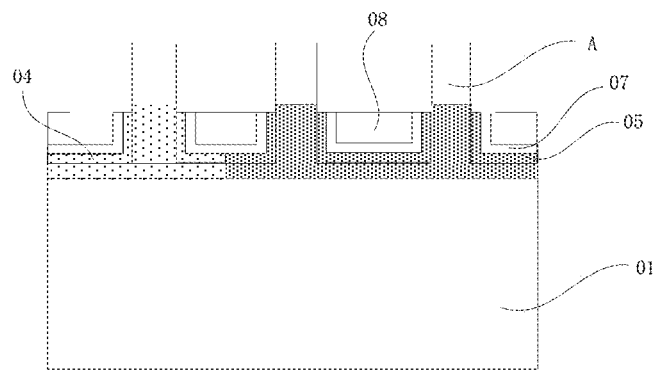

In step 12, the hard mask layer 03 and the buffer layer 02 are removed by etching to expose the top surfaces of the fin structure. Referring to FIG. 2k, the hard mask layer 03 and the buffer layer 02 are etched off, and the oxide layer 08 is also removed to expose the top surface of the fin structure, so as to form the structure in FIG. 2k.

Embodiment 2

The difference between embodiment 2 and embodiment 1 lies in that, in the embodiment 2, after the similar step 8 as in embodiment 1 is performed, till before the cap layer is deposited in step 9, the PSG layer and BSG layer arranged in contact with the upper surface of the substrate are removed, which is different from in the embodiment 1 where they are kept on the substrate, just keeping the PSG layer or the BSG layer on the sidewalls of the fin structure.

Figure 3A:
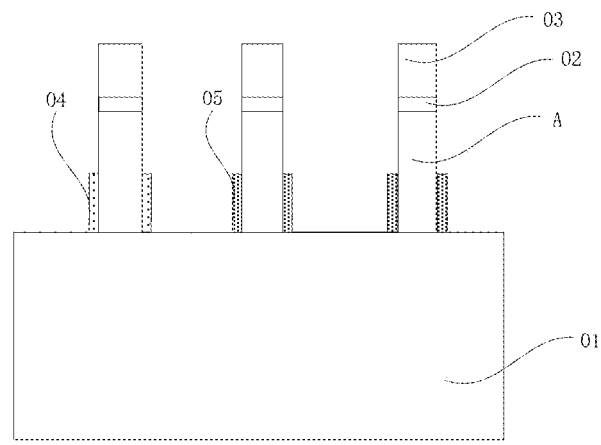
FIGS. 3a-3e illustrate schematic views of the structures post each fabrication step in the forming of the FinFET solid-phase source doping in embodiment 2 of the disclosure.

Referring to FIG. 3a, the PSG layer 05 and BSG layer 04 on the upper surface of the substrate 01 in step 9 are removed, and the remaining PSG layer 05 and BSG layer 04 are respectively located on the sidewalls of the fin structure. The height of the remaining PSG layer 05 and BSG layer 04 is about one third of the height of the fin structure A.

Figure 3B:
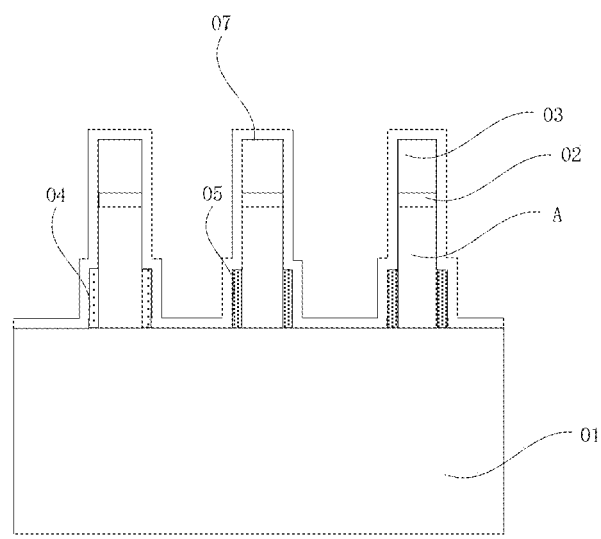

Then step 9 is performed, that is, a cap layer 07 is deposited to cover the stack layers, and the PSG layer 05 and the BSG layer 04 on the sidewalls of the fin structure A. In the present embodiment 2, since there are no PSG layer and BSG layer in the area on the upper surface of the substrate between the stack layers, the cap layer 07 now covers directly the area on the upper surface of the substrate 01 between the stack layers, and the formed structure is illustrated in FIG. 3b.

Figure 3C:
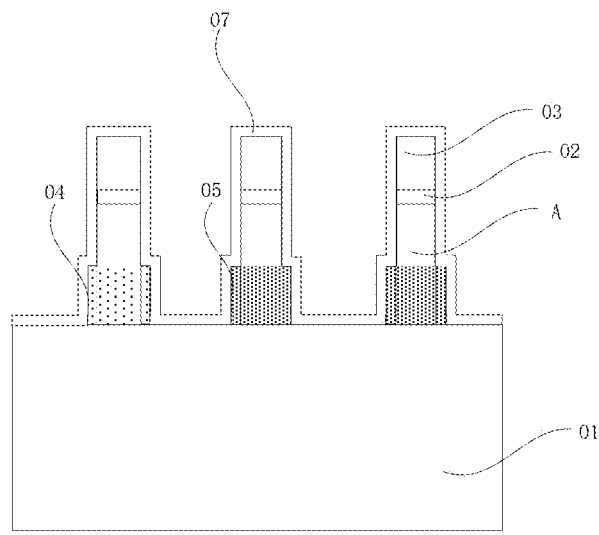

In step 10 in the present embodiment 3, annealing is performed to diffuse laterally the phosphorus in the PSG layer 05 and boron in the BSG layer 04 fin structure into the sidewalls of the fin structure. Referring to FIG. 3c, since there are no PSG layer and BSG layer in the area between the fin structures on the upper surface of the substrate, phosphorus in the PSG layer and boron in the BSG layer attached to the sidewalls of the fin structures respectively diffuse laterally into the area at the bottoms of the fin structure A, so as to form a structure in FIG. 3c.

Figure 3D:
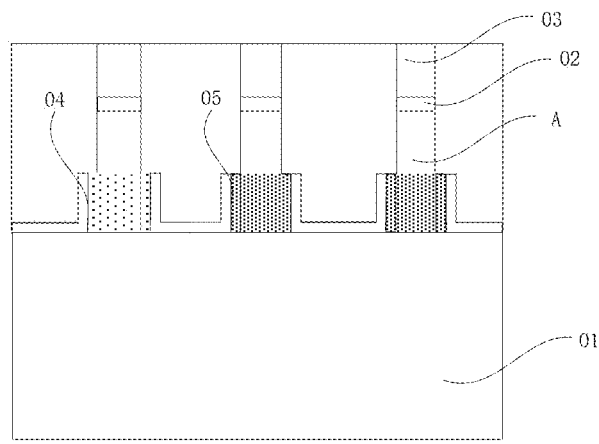

In step 11, the cap layer 07 above the PSG layer 05 and the BSG layer 04 is removed by etching, and an oxide layer 08 is deposited to fill spaces between the stack layers. The formed structure is as illustrated in FIG. 3d.

In other embodiments, after the cap layer 07 above the PSG layer 05 and the BSG layer 04 is removed by etching in step 11, the remaining PSG layer 05, the BSG layer 04 and the cap layer 07 may be fully removed, and then the oxide layer 08 is deposited to fill the space between the stack layers. Fully removing the remaining PSG layer, the BSG layer and the cap layer is more conducive to effectively filling the subsequent oxide layer 08 between the stack layers.

Figure 3E:
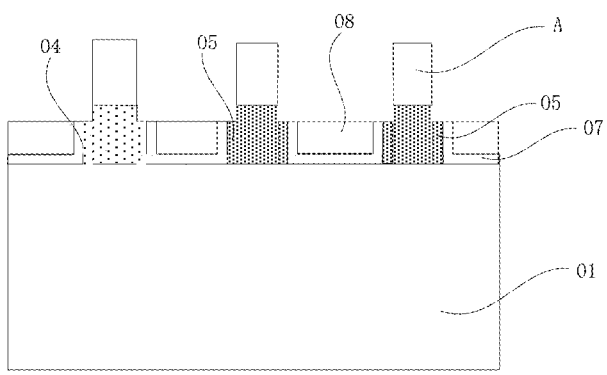

In step 12, the hard mask layer 03 and the buffer layer 02 are removed to expose the top surfaces of the fin structures. The formed structure is as illustrated in FIG. 3e.

To sum up, the solid-phase source doping method provided by the disclosure performs different kinds of anti-punch-through doping aimed at the fin structures of NMOS and PMOS. The disclosed method effectively controls the doping area in the fin structures by using silicon borate glass and silicon phosphate glass with preset thickness, height and concentration. The benefits of the techniques include avoiding damage to the fin structure after doping implantation e, improving the anti-punch-through implantation performance, effective doping ion diffusion in the fin structure, improving the distributions of phosphorus and boron in the fin structure, thus improving the mobility of carriers and device performance As an result, the disclosed technique overcomes various disadvantages in the prior art, and will have significant value in FINFET application in semiconductor industry.

The above embodiments are used for describing the principle and effect of the disclosure only, instead of limiting the disclosure. Those skilled in the art may modify or change the above embodiments without going beyond the spirit and scope of the disclosure. Therefore, all equivalent modifications or changes made by those skilled in the art without departing from the spirit and technical concept disclosed in the disclosure shall still be covered by the claims of the disclosure.

What is claimed is:

1. A method for doping a FinFET device, comprising a plurality of steps:
    step 1: providing a substrate having a stack of layers, wherein the stack of layers comprises a buffer layer on the substrate and a hard mask layer on the buffer layer; patterning the stack of layers to form a plurality of fin structures, wherein the plurality of fin structures comprises a first structure for a PMOS device, and a second structure for a NMOS device;
    step 2: depositing a BSG layer over the first structure and the second structure, and on an upper surface of the substrate between the first and the second structures;
    step 3: removing the BSG layer from the first structure while keeping the BSG layer on the second structure;
    step 4: depositing a PSG layer on the plurality of fin structures, wherein the PSG layer is configured to cover the BSG layer over the second structure, to cover the first structure, and the upper surface of the substrate between any two adjacent ones of the plurality of fin structures;
    step 5: removing the PSG layer from the second structure;
    step 6: forming a dielectric layer between any two adjacent ones of the plurality of fin structures, wherein a thickness of the dielectric layer is one third of a height of the plurality of fin structures;
    step 7: removing the PSG layer and the BSG layer from top surfaces and sidewalls of the plurality of fin structures above the dielectric layer;
    step 8: removing the dielectric layer to expose a remaining PSG layer and a remaining BSG layer;
    step 9: depositing a cap layer to cover the plurality of fin structures including the remaining PSG layer and the remaining BSG layer on the sidewalls;
    step 10: performing annealing process, wherein phosphorus in the PSG layer diffuses into the first structure and boron in the BSG layer diffuses into the second structure;
    step 11: removing the cap layer from above the remaining PSG layer on the first structure and from above the remaining BSG layer on the second structure, followed by depositing an oxide layer to fill a space between any two adjacent ones of the plurality of fin structures; and
    step 12: removing by etch process the hard mask layer and the buffer layer to complete FinFET source doping.

2. The method for doping the FinFET device according to claim 1, wherein a material of the buffer layer in step 1 comprises silicon dioxide.

3. The method for the FinFET device according to claim 1, wherein a material of the hard mask layer in step 1 comprises one of silicon nitride, a-C, a-Si, AlN, SIOC, and SIC.

4. The method for doping the FinFET device according to claim 1, wherein the BSG layer in step 2 comprises silicon borate glass having a concentration of boron in a range of 1E20-5E21/cm$^3$.

5. The method for doping the FinFET device according to claim 1, wherein the PSG layer in step 4 comprises silicon phosphate glass having a concentration of phosphorus in a range of 1E20-5E21/cm$^3$.

6. The method for doping the FinFET device according to claim 1, wherein a thickness of the BSG layer deposited in step 2 is in a range of 2-5 nm.

7. The method for doping the FinFET device according to claim 1, wherein a thickness of the PSG layer deposited in step 4 is in a range of 2-5 nm.

8. The method for doping the FinFET device according to claim 1, wherein the dielectric layer in step 6 comprises one of an organic layer and SiBARC.

9. The method for doping the FinFET device according to claim 1, wherein forming the dielectric layer in step 6 comprises applying a deposition technique.

10. The method for doping the FinFET device according to claim 1, wherein the cap layer deposited in step 9 further covers the remaining PSG layer and the remaining BSG layer on the upper surface of the substrate.

11. The method for doping the FinFET device according to claim 1, wherein performing annealing in step 10 further includes diffusion of phosphorus in the PSG layer and diffusion of boron in the BSG layer into the substrate.

12. The method for doping the FinFET device according to claim 1, wherein before the cap layer is deposited in step 9, the remaining PSG layer and the remaining BSG layer are removed from the upper surface of the substrate, while the PSG layer and the BSG layer on the sidewalls of the plurality of fin structures remain.

13. The method for doping the FinFET device according to claim 1, wherein depositing the oxide layer in step 11 comprises a flowable chemical vapor deposition technique.

14. The method for doping the FinFET device according to claim 1, wherein step 11 further comprises removing the remaining PSG layer, the remaining BSG layer, and the cap layer before depositing the oxide layer to fill the space between any two said fin structures.

* * * * *